(12) United States Patent
Knoedgen et al.

(10) Patent No.: US 9,407,132 B2
(45) Date of Patent: Aug. 2, 2016

(54) CONTROL CIRCUIT FOR MULTIPLE HIGH SIDE SWITCHES

(71) Applicant: Dialog Semiconductor GmbH, Kirchheim/Teck-Nabern (DE)

(72) Inventors: Horst Knoedgen, Munich (DE); Slawomir Malinowski, Graz-Seiersberg (AT)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 192 days.

(21) Appl. No.: 14/242,904

(22) Filed: Apr. 2, 2014

(65) Prior Publication Data

US 2015/0077075 A1    Mar. 19, 2015

(30) Foreign Application Priority Data

Sep. 17, 2013  (EP) .................................... 13184805

(51) Int. Cl.
*H02M 3/158*    (2006.01)
*H02M 1/088*    (2006.01)
*H02M 1/08*     (2006.01)

(52) U.S. Cl.
CPC ................ *H02M 1/088* (2013.01); *H02M 1/08* (2013.01); *H02M 3/158* (2013.01); *H02M 3/1584* (2013.01); *H02M 2003/1586* (2013.01); *H03K 2217/0063* (2013.01)

(58) Field of Classification Search
CPC . H02M 3/1584; H02M 3/158; H02M 3/1588; H02J 1/102
USPC ................... 323/271, 272, 289; 327/108–110
See application file for complete search history.

(56) References Cited

U.S. PATENT DOCUMENTS

| 4,727,261 | A  |   | 2/1988  | Fairchild |
|-----------|-----|---|---------|-----------|
| 5,818,281 | A  |   | 10/1998 | Ohura et al. |
| 5,936,387 | A  | * | 8/1999  | Tabata .................. H02M 7/538 323/225 |
| 6,490,182 | B2 | * | 12/2002 | Katoh ................. H02M 7/5387 363/131 |
| 2003/0193364 | A1 |   | 10/2003 | Liu et al. |
| 2010/0109625 | A1 |   | 5/2010  | Ohtake et al. |
| 2011/0018508 | A1 | * | 1/2011 | Ueunten ............... H03K 17/122 323/272 |

FOREIGN PATENT DOCUMENTS

JP         2011 055597         2/2011

OTHER PUBLICATIONS

European Search Report 13184805.3-1809, Mailed: Oct. 22, 2013, Dialog Semiconductor GmbH.

* cited by examiner

*Primary Examiner* — Gary L Laxton
(74) *Attorney, Agent, or Firm* — Saile Ackerman LLC; Stephen B. Ackerman

(57) ABSTRACT

The efficient control of a plurality of high side switches, e.g. the high side switches of half bridges is presented. A control circuit contains a charge provisioning unit to provide an electrical charge. The control circuit contains a plurality of sets of high control switches for the plurality of high side switches, respectively; wherein each set of high control switches is used to arrange the charge provisioning unit in parallel to a gate-source capacitance of the respective high side switch. The control circuit comprises a controller to, during a phase of a plurality of different phases, control a respective set of high control switches from the plurality of sets of high control switches to arrange the charge provisioning unit in parallel to the gate-source capacitance of the respective high side switch from the plurality of high side switches, to switch on the respective high side switch.

29 Claims, 7 Drawing Sheets

CONTROL CIRCUIT FOR MULTIPLE HIGH SIDE SWITCHES

TECHNICAL FIELD

The present document relates to the control of high side switches, e.g. the high side switches of half bridges. In particular, the present document relates to an efficient control circuit for controlling a plurality of high side switches.

BACKGROUND

High side switches (HS switches) are used in various different configurations. By way of example, HS switches may be used in the half bridges of power converters, e.g. DC-to-DC power converters such as buck converters. Such power converters may comprise a plurality of parallel constituent power converters, which are operated in a plurality of different phases, to form so called multi-phase power converters. The parallel arrangement of a plurality of constituent power converters may be beneficial for increasing the amount of electrical power which can be provided at the output of the power converter.

As a result of the parallel arrangement of multiple constituent power converters, multiple HS switches may be arranged in parallel. These HS switches need to be controlled by one or more appropriated control circuits.

SUMMARY

The present document describes a cost and size efficient control circuit which allows the control of a plurality of HS switches, e.g. of the plurality of HS switches of a multi-phase power converter. According to an aspect, a control circuit (also referred to as a driver circuit) for controlling a plurality of parallel high side switches of a respective plurality of parallel bridges is described. The high side switches may be arranged in series with respective low side switches to form half bridges. A source of the high side switch of a bridge may be coupled to a drain of the respective low side switch to provide a midpoint of the bridge. The half bridges may be coupled to a positive supply voltage (at a drain of the high side switch) and to ground (at a source of the low side switch). The half bridges may be used to switch the midpoint of the half bridge (at the source of the high side switch and the drain of the lower side switch) between the positive supply voltage and ground in a periodic manner (in accordance to a so called commutation cycle rate, wherein each commutation cycle comprises a time interval where the midpoint is at ground level and a time interval where the midpoint is at the level of the positive supply voltage).

The plurality of bridges (and the plurality of high side switches) may be comprised within a plurality of constituent power converters of a multi-phase power converter. In other words, the plurality of high side switches may be part of a plurality of constituent power converters of a multi-phase power converter. The multi-phase power converter may be a DC (Direct Current)-to-DC power converter, such as a buck converter.

The high side switches (and the low side switches) may be implemented as (or may comprise) N-channel metal oxide semiconductor (MOS) transistors, e.g. field effect transistors. Such N-channel MOS transistors are beneficial with respect to low PCB size and/or power consumption. Alternatively or in addition, the high side switches (and the low side switches) may be implemented as (or may comprise) P-channel MOS transistors or other kind of transistors. When using N-channel MOS transistors, the bridge typically couples a positive voltage at a drain of the high side switch to ground (via the low side switch). When using P-channel MOS transistors, the bridge typically couples a negative voltage at a drain of the high side switch to ground (via the low side switch). As such, the term high side switch may identify the switch of a bridge which is arranged at the end of the bridge which deviates from ground level.

The control circuit comprises a charge provisioning unit configured to provide an electrical charge. In particular, the charge provisioning unit may be configured to provide the electrical charge at a floating voltage. The charge provisioning unit may comprise a capacitor (also referred to as a bootstrap capacitor) and/or a transformer. The electrical charge may be provided by the charge provisioning unit using a supply voltage. The positive supply voltage at the drain of the high side switch is typically equal to or higher than the supply voltage used for providing the electrical charge of the charge provisioning unit.

Furthermore, the control circuit comprises a plurality of sets of high control switches for the plurality of high side switches, respectively. Each set of high control switches may be configured to arrange the charge provisioning unit in parallel to a gate-source capacitance of the respective high side switch. The charge provisioning unit may comprise a first output (e.g. a first end of a bootstrap capacitor) and a second output (e.g. a second end of a bootstrap capacitor). A set of high control switches may be configured to couple the first output to a gate of the respective high side switch and to couple the second output to a source of the respective high side switch. By doing this, the charge provisioning unit is arranged in parallel to the gate-source capacitance of the respective high side switch. This may be achieved by a set of high control switches comprising at least two high control switches, at least one for coupling/decoupling the first output to the gate of the respective high side switch and at least one for coupling/decoupling the second output to the source of the respective high side switch. The first and/or the second high control switches may be implemented as a diode.

The sets of high control switches may be arranged such that the sets are configured to couple the gate-source capacitance of the respective high side switches to the charge provisioning unit in a mutually exclusive manner. In other words, the sets of high control switches may be arranged such that when the gate-source capacitance of any one of the plurality of high side switches is coupled to the charge provisioning unit, the gate-source capacitance of all the others of the plurality of high side switches may be decoupled from the charge provisioning unit.

The control circuit comprises a controller configured to, during a phase of a plurality of different phases, control a respective set of high control switches from the plurality of sets of high control switches to arrange the charge provisioning unit in parallel to the gate-source capacitance of the respective high side switch from the plurality of high side switches, to switch on the respective high side switch. The plurality of different phases may comprise a plurality of different time intervals. The controller may be configured to couple a different one of the plurality of high side switches to the charge provisioning unit (in a mutually exclusive manner) for each of the plurality of different time intervals. As such, the controller may be configured to, during a time interval of a plurality of different time intervals, control a respective set of high control switches from the plurality of sets of high control switches to arrange the charge provisioning unit in parallel to the gate-source capacitance of the respective high side switch from the plurality of high side switches, to switch on the respective high side switch.

By doing this, the plurality of high side switches may be switched on using only a single charge provisioning unit. In other words, the control circuit may comprise only a single charge provisioning unit for charging the gate-source capacitance of the plurality of high side switches. As a result, the control circuit for controlling the plurality of high side switches may be implemented in a cost and PCB area efficient manner.

The controller may be configured to generate a first charge pulse for a first high side switch from the plurality of high side switches with the electrical charge provided by the charge provisioning unit. This may be achieved by controlling a respective first set of high control switches from the plurality of sets of high control switches such that the charge provisioning unit is arranged in parallel to the gate-source capacitance of the first high side switch for a limited on-pulse duration. By generating charge pulses for the different high side switches within the plurality of different phases, the different high side switches may be switched on within their respective different phases (i.e. within respective different time intervals which are assigned for switching on the different high side switches).

The controller may be configured to control the first set of high control switches to couple the charge provisioning unit to the gate and the source of the first high side switch for the on-pulse duration. Furthermore, the controller may be configured to decouple the charge provisioning unit from the first high side switch subsequent to the first charge pulse, such that the gate of the first high side switch is floating. Due to the charged gate-source capacitance, the first high side switch remains switched on, even when the gate of the first high side switch is floating. To the contrary, the floating of the gate of the first high side switch prevents a (substantial) discharging of the gate-source capacitance of the first high side switch. The others of the plurality of high side switches may be switched on in a similar manner (within their respective phases).

The control unit may further comprise a plurality of low control switches for the plurality of high side switches, respectively. The controller may be configured to control a first low control switch from the plurality of low control switches to short circuit the gate-source capacitance of the respective first high side switch, to switch off the respective first high side switch. In particular, the controller may be configured to control the first low control switch to short circuit the gate-source capacitance of the respective first high side switch for a pre-determined limited off-pulse duration. The first low control switch may be arranged between the gate and the source of the first high side switch. Furthermore, the first low control switch may be arranged to provide a short circuit of the gate and the source of the first high side switch, regardless the switching state of the first set of high control switches. The low control switches for the others of the plurality of high side switches may be arranged in a similar manner.

As such, the high side switches may be switched to the on-state and/or to the off-state using pulses. The charge pulses for putting the different high side switches in the on-state may be generated in different non-overlapping time intervals (corresponding to the different phases). By doing this, the same charge provisioning unit may be used for generating the charge pulses for all of the high side switches.

As indicated above, the plurality of high side switches may be assigned to the plurality of different phases, respectively. The plurality of different phases may comprise a plurality of different time intervals, respectively. The plurality of different phases may form a commutation cycle having a commutation cycle duration. The commutation cycle may be repeated at a commutation cycle rate. Within a commutation cycle, each high side switch may be switched on and off. Hence, by repeating the commutation cycle in a periodic manner, each high side switch may be switched on and off in a periodic manner.

The plurality of time intervals of the plurality of phases may add up to the commutation cycle duration. The plurality of time intervals may correspond to the time intervals which are assigned to the respective high side switches for switching on the respective high side switches. As such, the plurality of high side switches may be switched on during different, non-overlapping, time intervals (corresponding to the plurality of different phases).

The plurality of high side switches may comprise N high side switches with N being an integer greater than 1. Each of the plurality of phases may correspond to a time interval having a length of one over N of the commutation cycle duration. As such, each high side switch is assigned a time interval of one over N of the commutation cycle duration for switching on the high side switch. Hence, the on-pulse duration of the charge pulse for switching on a high side switch should be equal to or less than one over N of the commutation cycle duration. Typically, the on-pulse duration is only a fraction of one over N of the commutation cycle duration.

Adjacent phases of the plurality of phases may be offset by one over N of the commutation cycle duration with respect to each other. In other words, adjacent time intervals for switching on different ones of the plurality of high side switches may be offset by one over N of the commutation cycle duration with respect to each other.

As indicative above, the charge provisioning unit may comprise a bootstrap capacitor. Furthermore, the charge provisioning unit may comprise a set of charging switches. The controller may be configured to control the set of charging switches to couple the bootstrap capacitor to a supply voltage for re-charging of the bootstrap capacitor, during a charging time interval, when the bootstrap capacitor is not coupled to a gate-source capacitance of any one of the plurality of high side switches. As such, the bootstrap capacitor may be recharged in between different charge pulses. The controller may be configured to control the set of charging switches to couple the capacitor to the supply voltage within each of the plurality of phases. For this purpose, the on-pulse duration of a charge pulse may cover only a fraction of the total time interval which is assigned for switching on a high side switch. Another fraction of the total time interval may be assigned for the charging time interval (i.e. for re-charging the bootstrap capacitor of the charge provisioning unit).

The set of charging switches may comprise a first charging switch for coupling a first end of the bootstrap capacitor to a first output of a supply voltage and a second charging switch for coupling a second end of the bootstrap capacitor to a second output of the supply voltage. The first and/or the second charging switch may be implemented as a diode.

The control circuit may further comprise a plurality of pre-charging switches for the plurality of high side switches, respectively. A first pre-charging switch from the plurality of pre-charging switches may be configured to couple the gate of the respective first high side switch to the supply voltage. The controller may be configured to control the first pre-charging switch to couple the gate of the first high side switch to the supply voltage prior to arranging the charging provision unit in parallel to the gate-source capacitance of the first high side switch, i.e. prior to generating the charge pulse for putting the first high side switch to the on-state. The same may apply to the others of the plurality of pre-charging switches. As a result of the pre-charging, a charge provisioning unit with a reduced charge capacitance may be used, thereby reducing the cost and size of the control circuit.

The pre-charging of the gate-source capacitance of a particular high side switch may occur within the total time interval which is assigned to the switching on of the particular high side switch. As such, the total time interval may comprise a sub-time interval (i.e. the charging time interval) for re-charging a bootstrap capacitor of the charge provisioning unit, a sub-time interval for pre-charging the gate-source capacitance of the particular high side switch, and/or a sub-time interval (i.e. the on-pulse duration) for generating the charge pulse for switching on the particular high side switch.

Alternatively or in addition, the charge provisioning unit may comprise a transformer. Furthermore, the charge provisioning unit may comprise a pulse generation unit at a primary side of the transformer. The sets of high control switches may be configured to arrange a secondary side of the transformer in parallel to the gate-source capacitance of the respective high side switches (to provide the charge pulse to the respective high side switches). The controller may be configured to control the pulse generation unit to generate the charge pulse for charging the gate-source capacitance of a high side switch in synchronicity with the respective set of high control switches. This may be the case for all of the plurality of high side switches.

According to a further aspect, a multi-phase power converter configured to convert electrical energy at an input voltage into electrical energy at an output voltage is described. The multi-phase power converter comprises a plurality of constituent power converters which are operated in a plurality of different phases, respectively. The plurality of constituent power converters comprises a respective plurality of high side switches. Furthermore, the multi-phase power converter comprises a control circuit for controlling the plurality of parallel high side switches. The control circuit may comprise any combination of the features described in the present document.

According to another aspect, a method for switching on a plurality of parallel high side switches in a respective plurality of different phases is described. The method comprises providing an electrical charge using a charge provisioning unit. Furthermore, the method comprises, during each of the plurality of different phases, arranging the charge provisioning unit in parallel to a gate-source capacitance of a respective high side switch from the plurality of high side switches, to switch on the respective high side switch.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

As outlined in the introductory section, HS switches may be used in the half bridges of power converters. Such power converters may be implemented as multi-phase power converters comprising a plurality of parallel constituent power converters for a plurality of phases, respectively. The plurality of parallel constituent power converters may be operated with a pre-determined phase offset with respect to each other. By way of example, a two-phase power converter may comprise two constituent power converters which are arranged in parallel and which are operated with a phase offset of 180 degrees. In a similar manner, N (N>1) constituent power converters may be operated with a 360/N degrees phase offset with respect to each other, to form an N-phase power converter.

As a result of the parallel arrangement of power converters, the plurality of HS switches of the plurality of constituent power converters are typically also arranged in parallel. For cost and PCB (printed circuit board) space efficiency, it may be beneficial to use a single control circuit for the plurality of parallel HS switches. Such a cost and space efficient control circuit is described in the present document.

Figure 1:
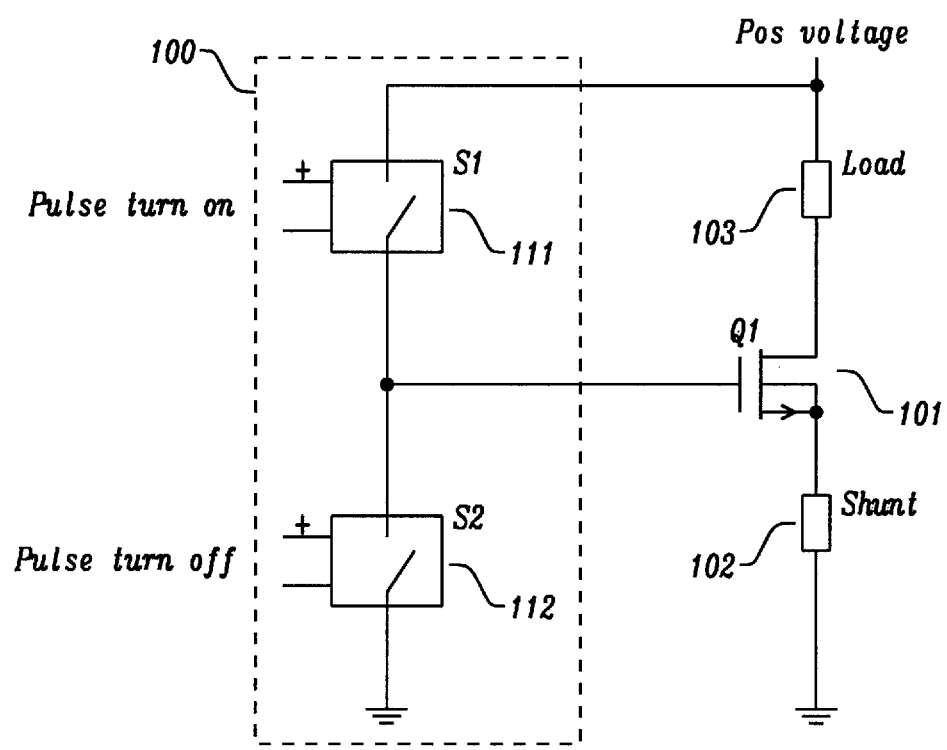
FIG. 1 shows a block diagram of an example control circuit for a HS switch.

FIG. 1 shows a block diagram of an example control circuit 100 for an HS switch 101. In the illustrated example, the HS switch 101 is arranged in series with a load resistor 103 and a shunt resistor 102 (e.g. for measuring a current through the HS switch 101). The HS switch 101 may be operated in a pulsed mode. For this purpose, the control circuit 100 comprises a high control switch S1 111 for generating a high control signal (in particular for generating a high control pulse) to be applied to a gate of the HS switch 101. The high control switch 111 may be configured to couple the gate of the HS switch 101 to a (positive) supply voltage. The high control switch 111 may be closed for an on-pulse duration to generate a high control pulse having the length of the on-pulse duration. The high control pulse charges the gate-source capacitance of the HS switch 101 for putting the HS switch 101 in the on-state (i.e. for closing the HS switch 101). As such, the on-pulse duration should be sufficiently long to ensure a sufficient charging of the gate-source capacitance of the HS switch 101 (such that the HS switch 101 is closed in a stable manner). Subsequent to the high control pulse, the gate of the HS switch 101 may float. As a result, the gate-source capacitance remains charged and the HS switch 101 remains closed.

The control circuit 100 further comprises a low control switch S2 112 configured to couple the gate of the HS switch 101 with ground for an off-pulse duration (possibly equal to the on-pulse duration). As a result, the gate-source capacitance of the gate of the HS switch 101 is discharged and the HS switch 101 is put into the off-state (i.e. the HS switch 101 is opened). The off-pulse duration should be sufficiently long to ensure a sufficient discharging of the gate-source capacitance of the HS switch 101 (such that the HS switch 101 remains open in a stable manner). Subsequent to the off-pulse duration, the gate of the HS switch 101 is floating, thereby maintaining the HS switch 101 in the off-state. Floating of the gate of the HS switch 101 may be achieved by maintaining the high control switch 111 and the low control switch 112 open at the same time.

Typically, the on- and off-pulse durations only cover a fraction of the duration of the on-state and of the duration of the off-state, respectively (e.g. 10% or less, 20% or less, 30% or less, 40% or less, 50% or less). As a consequence, the gate of the HS switch 101 is typically floating for the complementary time duration. These complementary time durations may be used for the control of another HS switch, e.g. the HS switch of a further constituent power converter of a multi-phase power converter.

Hence, an HS switch 101, e.g. a MOS (metal oxide semiconductor) transistor, can be switched on or off by a short (high or low) control pulse. If the HS switch 101 is switched on or off and the nodes (drain/source) of the HS switch do not see a significant voltage change (as is the case for the HS switch 101 which is typically coupled to a constant positive voltage), the stored energy of the gate-source capacitor and of the other capacitors of the HS switch 101 remain at a substantially constant level. Only leakage may lead to a (typically minor) change of the gate voltage.

The pulse durations (i.e. the on- and off-pulse durations) should have a minimum length, in order to ensure that the HS switch Q1 101 reaches stabilized (on-state or off-state) operating points. Subsequent to reaching a stabilized operating point, the voltage typically remains (substantially) constant at the gate of the HS switch 101. The parasitic capacitances of the HS switch 101 typically do not comprise any discharge resistors. The only source of a leakage current may be leakage from the control switches S1 111 and S2 112 of the control circuit 100.

It may be beneficial to use N-channel MOS transistor (e.g. Field Effect Transistors, FET) as HS switches 101, due to the benefits of chip area and cost. Additionally, the average driver current consumption is smaller when using an N-channel transistor compared to a HS switch comprising a P-channel transistor. By way of example, when comparing N-channel transistors and P-channel transistors having the same on-resistance Ron, the P-channel transistors require a silicon area which is approx. 3 times bigger than the N-channel transistors. This also means that the P-channel transistors comprise a three times bigger parasitic capacitance, which needs to be charged or discharged to switch the transistors. Consequently, N-channel transistors lead to a reduced current consumption of the control circuit (or driver circuit) 100.

On the other hand, the switching of an N-channel transistor 101 typically requires the use of a so called bootstrap capacitor. To turn-on an N-channel high side switch 101, a gate voltage may be required, which is higher than the supply voltage (at the drain of the switch 101). This may require the use of charge provisioning means at a floating voltage, such as a bootstrap capacitor, for switching on the HS switch 101. When using a P-channel HS switch 101 such bootstrapping circuitry is typically not required.

As outlined above, the present document is particularly focused on controlling a plurality of parallel HS switches 101 (e.g. of a multi-phase power converter). This may require the use of a plurality of bootstrapping components for each phase of the power converter, notably if N-channel transistors are used as high side switches.

In the present document control circuits are described which use a single bootstrapping capacitor (or a single charge provisioning unit) for a plurality of phases of a multi-phase power converter. In other words, the control circuits described in the present document may be configured to control a plurality of parallel HS switches 101 at different phases using only a single bootstrapping capacitor. This may be achieved by making use of the parasitic capacitances of the HS switches 101, in order to maintain the HS switch 101 in the on-states/off-states.

By using only a single capacitor for turning on a plurality of HS switches 101, the number of external components and the cost of the control circuit 100 may be reduced and the PCB area of the control circuit 100 and of the multi-phase power converter can be reduced. The use of only a single bootstrapping capacitor and the gained chip area may also allow for an integration of the bootstrapping capacitor.

In a multi-phase power converter, the switching phases of the different phases are typically synchronized and shifted with respect to one another with a constant phase offset (e.g. 360/N degrees for an N-phase power converter). For a two-phase buck converter, a phase shift of 180 degrees is typically applied between the two phases. In order to turn on a HS switch 101 of one of the constituent power converters of the multi-phase power converter, electrical energy has to be delivered to the gate-source capacitance of the HS switch 101, and in order to turn off the HS switch 101 the same gate-source capacitance has to be discharged. In a two-phase power converter the two gate-source capacitances of the two parallel HS switches 101 each have to be charged and discharged once per clock cycle, leading to two charging/discharging operations per commutation cycle. As such, an N-phase power converter involves N charging/discharging operations per commutation cycle for the N parallel HS switches 101 of the N constituent power converters, respectively.

Figure 2:
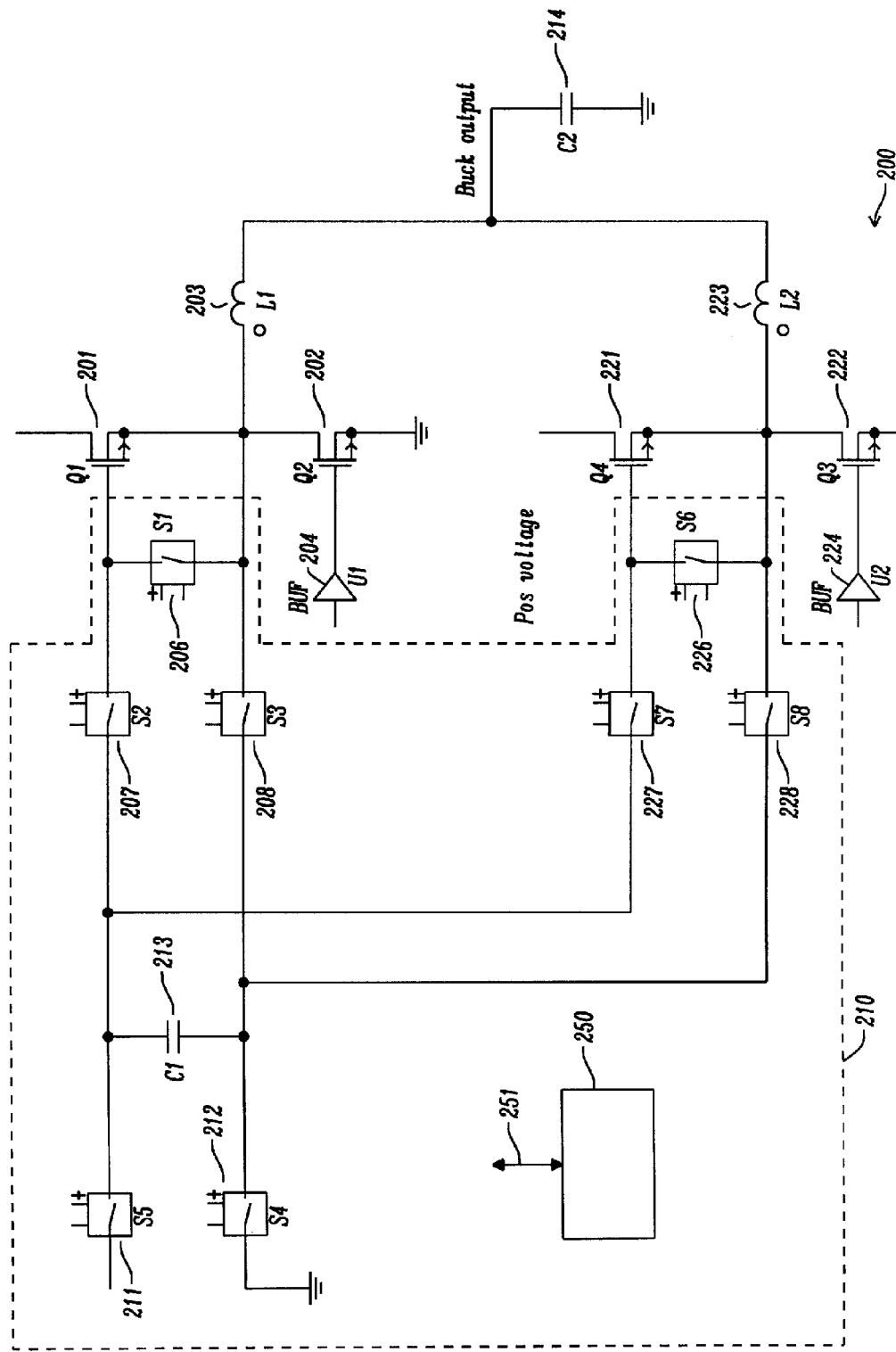
FIG. 2 shows a block diagram of an example control circuit for controlling a plurality of parallel HS switches.

In the present document, it is proposed to use the same bootstrapping capacitor for performing the N charging operations, which are performed at N different phases, i.e. during N different time intervals, of a commutation cycle. FIG. 2 shows an example two-phase buck power converter 200 comprising a first HS switch 201 of a first constituent power converter and a second HS switch 221 of a second constituent power converter. Furthermore, FIG. 2 shows an example control circuit 210 which is configured to control the first and second HS switches 201, 221 using a single bootstrap capacitor 213.

The first constituent power converter comprises a first half bridge comprising the first HS switch 201 and a first low side (LS) switch 202, as well as a first inductor 203. In a similar manner, the second constituent power converter comprises a second half bridge comprising the second HS switch 221 and a second LS switch 222, as well as a second inductor 223. The first and second constituent power converters provide electrical energy to the output capacitor 214. The first LS switch 202 is controlled using a first LS control unit 204 and the second LS switch 222 is controlled using a second LS control unit 224. The first and second half bridges comprise respective HS and LS switches which are arranged in series between a (positive) supply voltage and ground. The respective inductors may be coupled to a midpoint of the respective half bridges, between the respective HS and LS switches.

The first and second constituent power converters and in particular the first and second half bridges are operated at different phases with respect to one another, wherein the phase offset is typically 180 degrees in case of a two-phase power converter. This also means that the first and second HS switches 201, 221 are operated with a 180 degrees phase offset with respect to one another. In particular, this means that the on-states and/or the off-states of the first and second HS switches 201, 221 are offset with respect to one another by the phase offset (of 180 degrees).

Figure 4A:
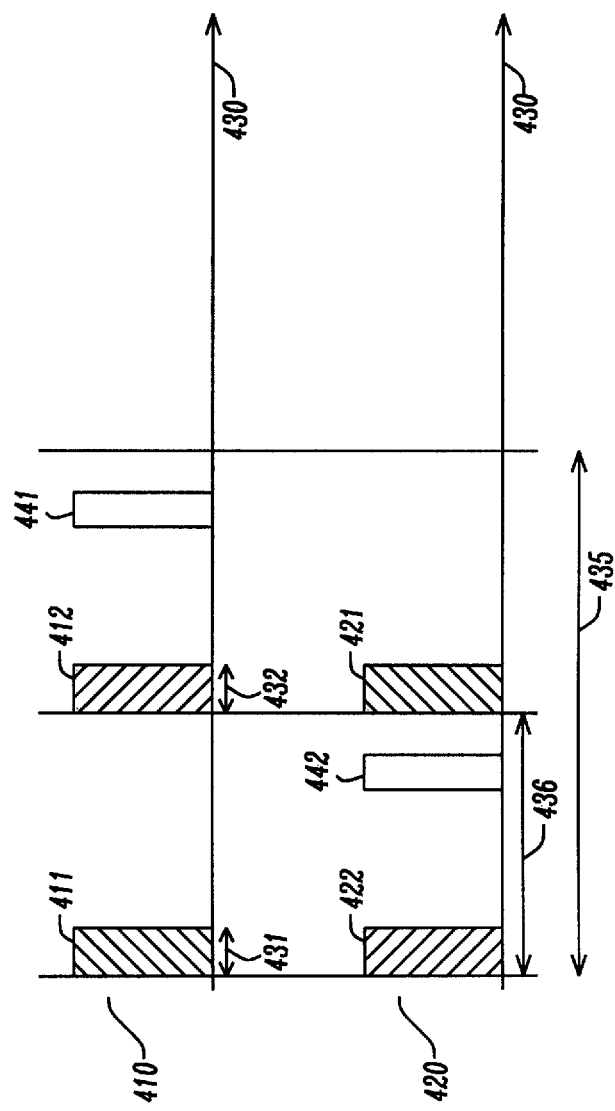
FIG. 4a illustrates an example switching diagram for controlling a plurality of HS switches.

This is illustrated in FIG. 4a which shows example switching diagrams 410, 420 for the first and second HS switches 201, 221, respectively. The switching diagram 410, 420 shows the control pulses 411, 412 for controlling the switching states of the first HS switch 201 and the control pulses 421, 422 for controlling the switching states of the second HS switch 221. The control pulses 411, 421 are high control pulses for putting the respective HS switch 201, 221 in the on-state and the control pulses 412, 422 are low control pulses for putting the respective HS switch 201, 221 in the off-state. The high control pulses 411, 421 have an on-pulse duration 431 and the low control pulses 412, 422 have an off-pulse duration 432. FIG. 4a shows the control pulses of one commutation cycle 435 along the time line 430. Typically, the control pulses 411, 412, 422, 421 are repeated periodically for succeeding commutation cycles 435.

As can be seen from FIG. 4a, the control pulses 411, 412 for the first HS switch 201 are offset by a fixed phase offset 436 (wherein the phase offset 436 corresponds to half the length of a commutation cycle 435 for the case of a two-phase power converter) with respect to the control pulses 422, 421 of the second HS switch 221. In particular, it can be seen that the high control pulse 411 for putting the first HS switch 201 into the on-state is generated within the first half of the commutation cycle 435 and the high control pulse 421 for putting the second HS switch 221 into the on-state is generated within the second half of the commutation cycle 435. As such, the high control pulses 411, 421 for the first and second HS switches 201, 221 occur at different time instants 430. This is due to the phase offset 436 between the switching diagrams 410, 420 as shown in FIG. 4a.

This observation is used to provide a control circuit 210 which comprises only a single bootstrap capacitor 213 for putting a plurality of HS switches 201, 221, which are operated in different phases, into the on-state.

FIG. 2 shows an example control circuit 210 which comprises first and second charging switches 211, 212 (also referred to as a set of charging switches 211, 212). The first and second charging switches S5 211, S4 212 may be used to charge the bootstrap capacitor 213, i.e. to provide electrical energy to the bootstrap capacitor 213. In particular, the first and second charging switches 211, 212 may be configured to couple the bootstrap 213 to a supply voltage, to charge the bootstrap capacitor 213.

Furthermore, the control circuit 210 comprises first high control switches S2 207, S3 208 (also referred to as a first set of high control switches 207, 208) and a first low control switch S1 206. The first control switches 206, 207, 208 may be used to generate the control pulses 411, 412 for controlling the first HS switch 201. In a similar manner, the control circuit 210 comprises second high control switches S7 227, S8 228 (also referred to as a second set of high control switches 227, 228) and a second low control switch S6 226. The second control switches 226, 227, 228 may be used to generate the control pulses 421, 422 for controlling the second HS switch 201.

In the following, it assumed that the bootstrap capacitor 213 is pre-charged and comprises sufficient energy to charge the gate-source capacitance of the HS switches 201, 221. For generating the first high control pulse 411 for putting the first HS switch 201 into the on-state, the first high control switches 207, 208 may be closed, while the first low control switch 206 is open, to couple the capacitor 213 in parallel to the gate and source of the first HS switch 201, to thereby charge the gate-source capacitor of the first HS switch 201 and to thereby open the first HS switch 201. The first high control switches 207, 208 may only be closed for the on-pulse duration 431 to generate the first high control pulse 411 having the on-pulse duration. The second high control switches 227, 228 typically remain open, when generating the first high control pulse 411, such that the charge of the single bootstrap capacitor 213 is only provided to the first HS switch 201.

For generating the first low control pulse 412, the first low control switch 206 may be closed for the off-pulse duration 432. By closing the first low control switch 206, the gate-source capacitance of the first HS switch 201 is short circuited to discharge the gate-source capacitance of the first HS switch 201.

In a similar manner, the second high control switches 227, 228 may be used to couple the bootstrap capacitor 213 in parallel to the gate-source capacitance of the second HS switch 221 to generate the second high control pulse 421. The first high control switches 207, 208 typically remain open when closing the second high control switches 227, 228. The second low control switch 226 may be closed to short circuit the gate-source capacitance of the second HS switch 221 and to thereby generate the second low control pulse 422.

As such, the sets of high control switches may be controlled to generate high control pulses for the respective HS switches in a mutually exclusive manner, using the electrical charge provided by the single bootstrap capacitor. The control circuit 210 may comprise a controller 250 for controlling the different switches 207, 208, 206, 227, 228, 226, 211, 212 of the control circuit 210. The different switches may be controlled using control signals 251.

In order to ensure that the single bootstrap capacitor 213 is sufficiently charged for generating the first high control pulses 411 (for the first HS switch 201) and the second high control pulses 421 (for the second HS switch 221), the charging switches 211, 212 may be closed periodically to recharge the bootstrap capacitor 213. The recharging of the capacitor 213 may be performed between the time instants 430 when the high control pulses 411, 421 are generated. This is illustrated in FIG. 4a which shows a first recharging pulse 441 subsequent to the second high control pulse 421 and prior to the first high control pulse 411 of the following commutation cycle 435, for recharging the bootstrap capacitor 213 in preparation for the generation of the first high control pulse 411. In a similar manner, FIG. 4a shows a second recharging pulse 442 subsequent to the first high control pulse 411 and prior to the second high control pulse 421 of the same commutation cycle 435, for recharging the bootstrap capacitor 213 in preparation for the generation of the second high control pulse 421. The first and second recharging pulses 441, 442 may be generated by closing the charging switches 211, 212, to couple the bootstrap capacitor 213 with a supply voltage. By decoupling the bootstrap capacitor 213 from the supply voltage, an electrical charge at a floating voltage may be provided.

The low control switches 206, 226 can be used for switching off the HS switches 201, 221, respectively, at any required time. On the other hand, typically the turn-on time for the first and second HS switches 201, 221 is synchronized and predefined. The bootstrapping or flying capacitor C1 213 may be used to turn-on either the first HS switch Q1 201 or the second HS switch Q2 with a phase shift of 180 degrees, using the pair of high control switches S2 207, S3 208 and S7 227, S8 228, respectively. At each cycle 435, the flying capacitor C1 213 may be charged (recharged) using the charging switches S4 212, S5 211. In the example two-phase buck converter 200 of FIG. 2a, the flying capacitor C1 213 is used twice within the clock cycle 435.

It should be noted that the control circuit 210 may be configured to control a general number N of HS switches 201 of an N-phase power converter, with N being an integer greater than 1 (e.g. 2 or more, 3 or more, 5 or more). In this case, the control circuit 210 may comprise N sets of high control switches 207, 208 and N low control switches 206 for the N HS switches 201, respectively. The single flying capacitor 213 may be used N times during a commutation cycle 435 to generate N high control pulses 411 for the N HS switches 201, respectively. The N high control pulses 411 may then be offset by a phase offset 436 of 360/N degrees. The N sets of high control switches 207, 208 may be closed in a mutually exclusive manner to couple the bootstrap capacitor 213 to the gate-source capacitance of the N HS switches 201 in a mutually exclusive manner.

Additional the sequence can be modified to a quasi parallel switching. This means that the plurality of HS switches 201 may be switched into the on-state at similar time instants within a commutation cycle 425. In other words, the N high control pulses 411 for putting N HS switches 201 into the on-state may not be equally distributed across the length of a commutation cycle 425. In particular, the N high control pulses 411 may occur within a fraction of the length of the commutation cycle 425, e.g. a fraction which is 50% or less, 40% or less, 30% or less, 20% or less or 10% or less of the length of the commutation cycle 425. Nevertheless, two adjacent high control pulses 411 may be interleaved by a recharging pulse 441 for providing the electrical charge to the bootstrap capacitor 213 for generating the subsequent high control pulse 411. The quasi parallel switching of at least some of the plurality of HS switches 201 may occur subject to load transients, in order to provide additional electrical power to the output of a power converter.

Figure 3:
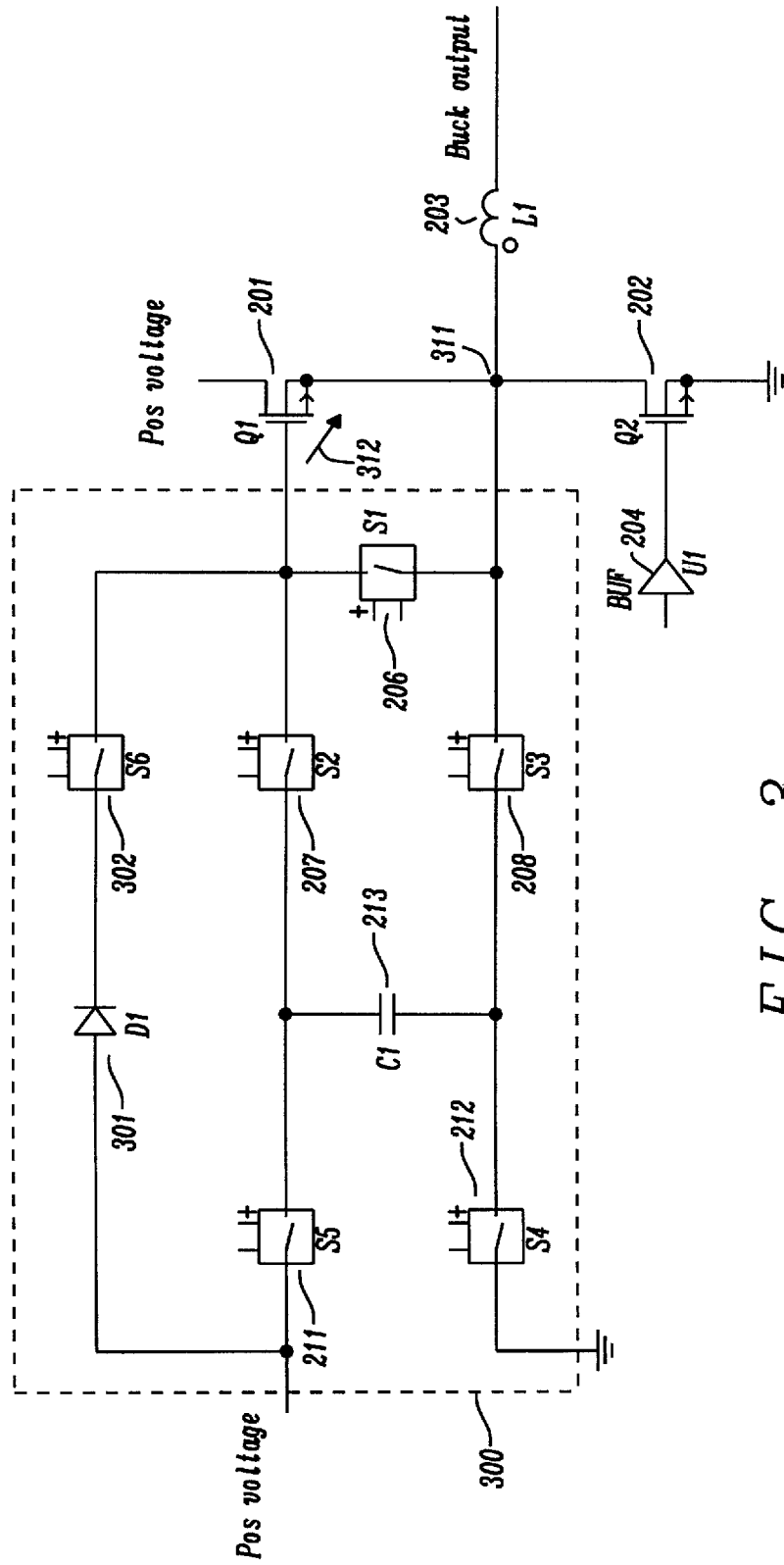
FIG. 3 shows a block diagram of another example control circuit for a HS switch.

FIG. 3 shows an example control circuit 300 comprising additional circuitry for improving the start-up of the control of the HS switch 201. In particular, the control circuit 300 comprises a pre-charging switch 302 which is configured to couple the gate of the first HS switch 201 directly to the supply voltage (which may also be used for charging the flying capacitor 213). As such, the pre-charging switch 302 may be used to couple the gate of the first HS switch 201 to the supply voltage to pre-charge the gate-source capacitance of the first HS switch 201. For this purpose, the pre-charging switch 302 may be closed prior to (and/or in preparation to) generating the first high control pulse 411, to pre-charge the gate-source-capacitance of the first HS switch 201 and to thereby reduce the charge which needs to be provided by the flying capacitor 213. As a result of such a pre-charging operation, the size of the flying capacitor 213 may be reduced, thereby reducing the cost and size of the control circuit 300.

The switching of the pre-charging switch may be controlled by the controller 250 of the control circuit as shown in FIG. 2.

The pre-charging switch 302 may be arranged in series with a pre-charging diode 301 which is configured to prevent a discharging of the gate-source capacitance of the first HS switch 201 towards the supply voltage. Alternatively or in addition, the pre-charging switch 302 may be operated in a pulsed manner. In particular, the pre-charging switch 302 may be opened again, when (or prior to) coupling the bootstrap capacitor 213 to the gate-source capacitance of the HS switch 201, to prevent a discharging of the gate-source capacitance.

Figure 4B:
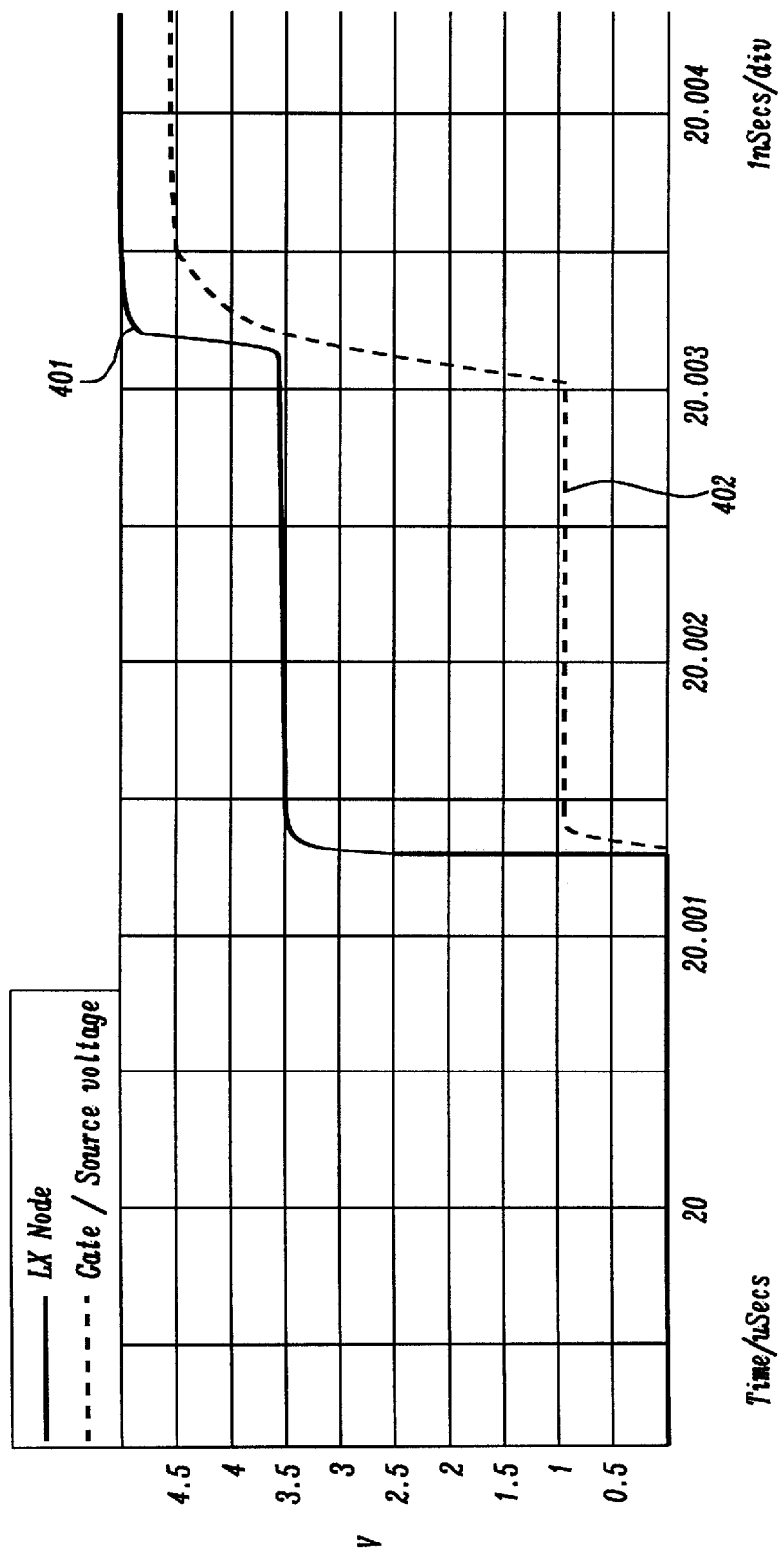
FIG. 4b illustrates an example evolution of voltages at the HS switch during the transition between an off-state and an on-state of the HS switch.

FIG. 4b illustrates the effect of the pre-charging operation. In particular, FIG. 4b shows an example gate/source voltage 312, 402 across the gate-source capacitance of the first HS switch 201 (see FIG. 3) and an example midpoint voltage 401 at the midpoint 311 of the first half bridge (see FIG. 3). It can be seen that as a result of the pre-charging operation (by closing the pre-charge switch 302 prior to generating the first high control pulse 411), the gate/source voltage 402 is brought up to a first voltage level (1V in the illustrated example). This has the effect that the first HS switch 201 is closed to a certain extent (with a relatively high Ron), thereby increasing the midpoint voltage 401. In the illustrated example, the positive voltage at the drain of the first HS switch 201 is 5V and it can be seen that due to the partially opened first HS switch 201, the midpoint voltage 401 is only brought up to 3.5V, subsequent to the pre-charging operation.

However, when generating the first high control pulse 411 (at time instant 20.003 in FIG. 4a), the gate-source capacitance of the first HS switch 201 is charged (as illustrated by the rising gate/source voltage 402) and the first HS switch 201 is closed completely (as illustrated by the midpoint voltage 401 rising to 5V). Due to the pre-charging operation, the charge which is required to fully charge the gate-source capacitance of the first HS switch 201 is reduced, thereby allowing for the use of a flying and/or bootstrap capacitor 213 having a reduced capacitance.

In case of the control of a plurality of HS switches 201, 221, the control circuit 300 may comprise a plurality of pre-charging switches 302 and a plurality of pre-charging diodes 301 for the plurality of HS switches 201, 221, respectively.

Hence, if the midpoint node 311 is at zero voltage, the pre-charging diode D1 301 together with the pre-charging switch S6 302 may be used to partly charge the gate of the HS switch Q1 201 (see FIG. 3). The remaining charge may then be provided using the charge pump (or charge provisioning unit) which is implemented using the bootstrap capacitor 213. By doing this, the bootstrap capacitor 213 may be implemented with a reduce size.

Additionally a small charge pump (e.g. a Dickson voltage multiplier) may be provided in parallel to the gate-source capacitance of the HS switch 201 for leakage losses compensation of the gate-source capacitance of the HS switch 201. Such a charge pump may exhibit a capacitance which is substantially smaller than the capacitance of the bootstrap capacitor 213, and by therefore be implemented in a cost efficient manner. Alternatively or in addition, the set of high control switches 207, 208 may be controlled to regularly re-charge the gate-source capacitance of the HS switch 201 using charge provided by the bootstrap capacitor 213. By recharging the gate-source capacitance using such a charge pump, the HS switch 201 can be switched on permanently.

It should be noted, that the HS switch 201 may be switched on in a soft manner by using multiple charge pulses 411 with a controlled length. In other words, the high control pulse 411 may be implemented as a sequence of high control pulses (with reduced duration) to control the transition of the HS switch 201 from the off-state to the on-state. The accumulated duration of the sequence of high control pulses may add up to the on-pulse duration 431, to ensure that a sufficient charge for closing the HS switch 201 is provided.

Figure 5:
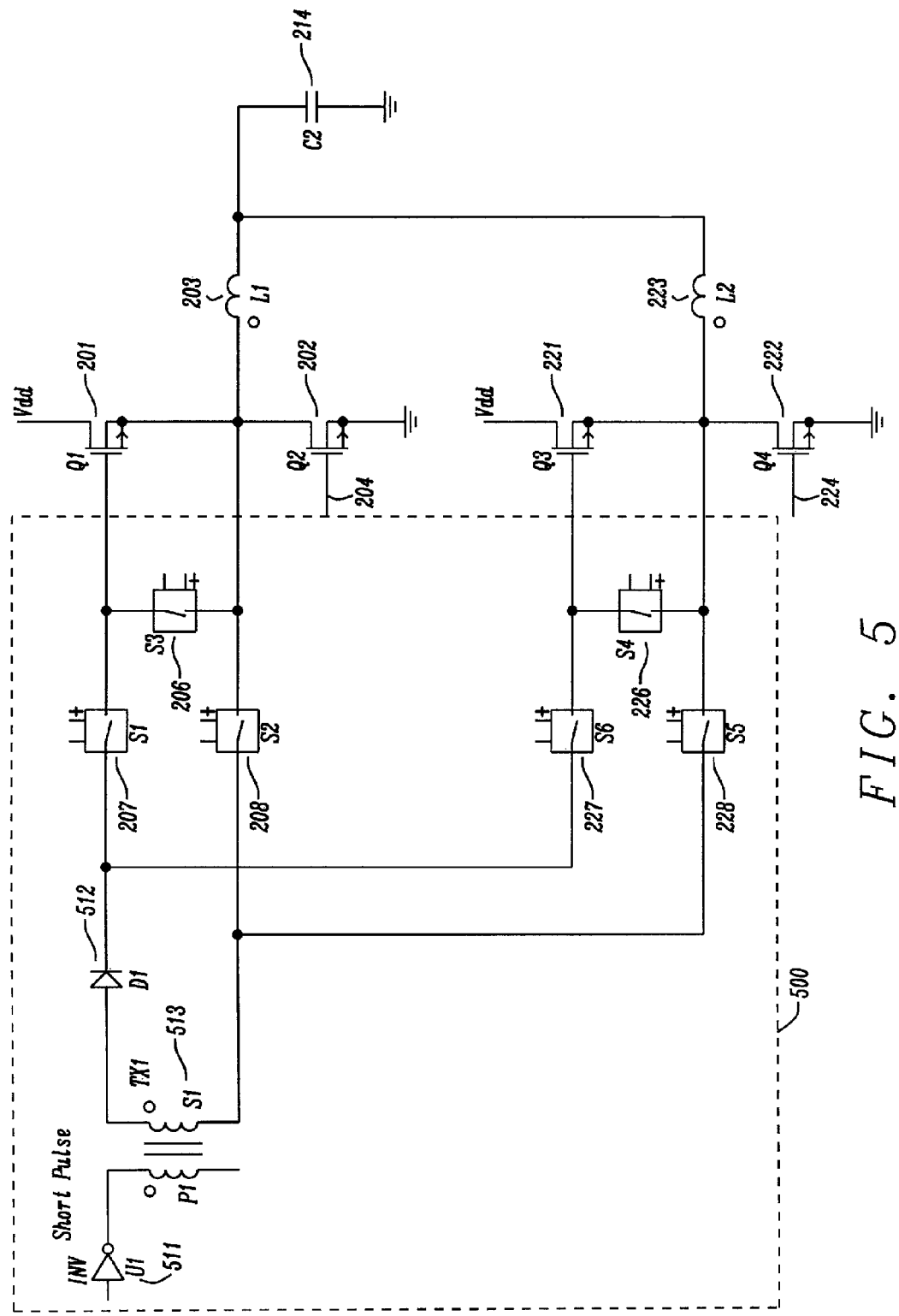
FIG. 5 illustrates another example control circuit for controlling a plurality of parallel HS switches.

Instead of or in addition to using a flying capacitor 213 as a source of energy for charging the gate-source capacitance of the HS switch 201, a pulse transformer 513 may be used, as illustrated in FIG. 5. The transformer 513 may be excited by energy pulses which are generated by a pulse generator 511 on the primary side of the transformer 513. The energy pulses may be provided at the secondary side of the transformer 513 and may be provided to the first and second HS switches 201, 221, respectively, using the first high control switches 207, 208 and the second high control switches 227, 228, respectively. A diode D1 512 may be used to prevent an energy flow from the gate-source capacitances of the first and second HS switches 201, 221 towards the transformer 513.

In a similar manner to the flying capacitor 213, the transformer 513 may be used to generate a floating voltage which may be arranged in parallel to the gate-source capacitances of the first and second HS switches 201, 221 to generate the first and second high control pulses 411, 421, respectively.

By using a transformer 513 which is driven with short pulses, the pulse is transferred from the primary side to the secondary side. The DC component of the pulse will typically be very low. The pulse duration 431 may be in the range of 3% of the repetition frequency or of the commutation cycle 435. The pulse duration should be sufficiently long to ensure that the HS switch 201 is switched on totally and that the voltage at the midpoint 311 is stabilized.

As indicated above, if required, the recharging of the gate-source capacitance of the HS switch 201 may provide a DC operation of the HS switch 201. The recharging may be used to compensate for a leakage current of the gate-source capacitance.

Various variants of the control circuits and of the power converter may be provided. By way of example, the HS switches 201 may be divided for Ron control and/or for optimization of the gate charge with respect to the flowing current. In particular, the HS switches 201 may be implemented as a serial and/or parallel arrangement of HS switches 201. Each of the switches of the serial and/or arrangement of HS switches may be controlled as outlined in the present document. By replacing an HS switch 201 with a serial/parallel arrangement of sub-switches, the parameters of the resulting HS switch may be adapted to the different requirements of different applications. By way of example, the HS switch may be adapted to a high or low power mode, by modifying the number of sub-switches which are used, i.e. the number of sub-switches which are actually commutated. Alternatively or in addition, the on-resistance Ron of the resulting HS switch may be adapted. By way of example, the on-resistance Ron may be increased for improved current monitoring. Alternatively or in addition, the gate voltage of the resulting HS switch may be adapted, e.g. for low voltage applications.

Furthermore, it should be noted that an overvoltage at the flying capacitor 213 may be used to compensate for charging losses. In other words, by charging the flying capacitor 213 with a voltage which is higher than the gate-source voltage of the HS switch 201, a sufficient charging of the gate-source capacitance of the HS switch 201 can be ensured, even when charging losses occur.

It should be noted that the control circuits which are described in the present document are applicable for HS switches 201, 221 in general, and are not limited to the application within power converters, notably buck converters. By way of example, the control circuits are also applicable to capacitive charge pumps and/or capacitive charge dividers.

Figure 6:
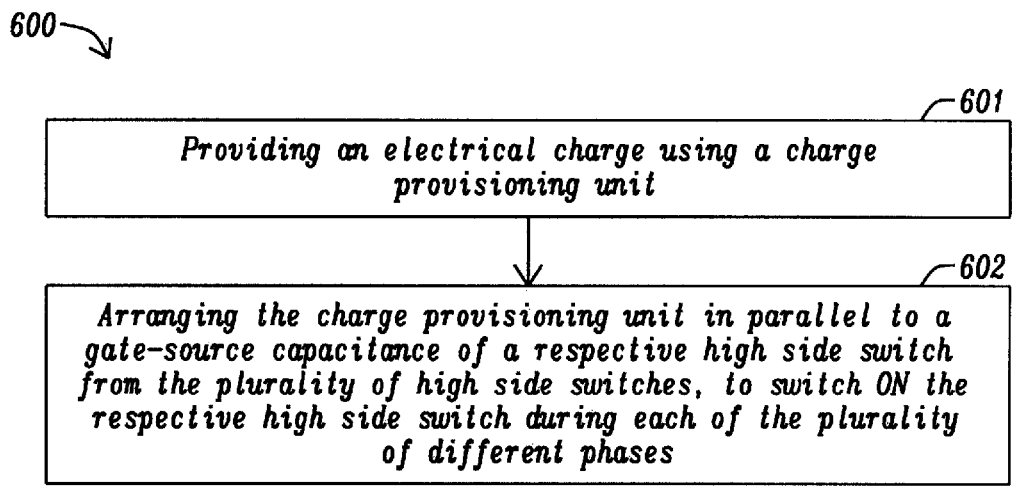
FIG. 6 shows a flow chart of an example method for controlling a plurality of parallel HS switches.

FIG. 6 shows a flow chart of an example method 600 for controlling a plurality of parallel HS switches 201, 221. In particular, FIG. 6 shows the flow chart of an example method 600 for switching on a plurality of parallel HS switches 201, 221 within a respective plurality of different phases. The plurality of different phases typically corresponds to a plurality of different time intervals. The method 600 comprises providing 601 an electrical charge, e.g. using a charge provisioning unit 213, 513. Examples for such a charge provisioning unit 213, 513 are the bootstrapping capacitor 213 (described in the context of FIG. 2) and the transformer 513 (described in the context of FIG. 5). In particular, the charge provisioning unit 213, 513 may be configured to provide an electrical charge at a floating voltage. The method 600 further comprises the step of arranging 602 the charge provisioning unit in parallel to a gate-source capacitance of a respective HS switch 201 from the plurality of HS switches 201, 221, to switch on the respective high side switch 201, during each of the plurality of different phases. In other words, during each of the plurality of different phases, a different one of the plurality of HS switches 201, 221 may be arranged in parallel to the charge provisioning unit, i.e. a different one of the plurality of HS switches 201, 221 may be switched on. By doing this, a single charge provisioning unit may be used to switch on a plurality of HS switches.

In the present document, driver or control circuits for controlling a plurality of parallel HS switches 201, 221 have been described. The control circuits are beneficial as they make use of a single energy or charge provisioning unit 213, 513 for generating the high control signals for the plurality of HS switches 201, 221. As a result of using only a single charge provisioning unit 213, 513, the cost and the size of the control circuit and of a power converter comprising such a control circuit can be reduced.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A control circuit for controlling a plurality of parallel high side switches of a respective plurality of parallel bridges; the control circuit comprising
    a charge provisioning unit configured to provide an electrical charge;
    a plurality of sets of high control switches for the plurality of high side switches, respectively; wherein each set of high control switches is configured to arrange the charge provisioning unit in parallel to a gate-source capacitance of the respective high side switch; and
    a controller configured to, during a phase of a plurality of different phases, control a respective set of high control switches from the plurality of sets of high control switches to arrange the charge provisioning unit in parallel to the gate-source capacitance of the respective high side switch from the plurality of high side switches, to switch on the respective high side switch; wherein the controller is configured to generate a first charge pulse for a first high side switch from the plurality of high side switches with the electrical charge provided by the charge provisioning unit, by arranging the charge provisioning unit in parallel to the gate-source capacitance of the first high side switch for a limited on-pulse duration using a respective first set of high control switches from the plurality of sets of high control switches; and wherein the controller is configured to control the first set of high control switches to couple the charge provisioning unit to a gate and source of the first high side switch for the on-pulse duration; and to decouple the charge provisioning unit from first high side switch subsequent to the first charge pulse, such that the gate of the first high side switch is floating.

2. The control circuit of claim 1, wherein
the control unit further comprises a plurality of low control switches for the plurality of high side switches, respectively; and
the controller is configured to control a first low control switch from the plurality of low control switches to short circuit the gate-source capacitance of the respective first high side switch, to switch off the respective first high side switch.

3. The control circuit of claim 2, wherein the controller is configured to control the first low control switch to short circuit the gate-source capacitance of the respective first high side switch for a pre-determined limited off-pulse duration.

4. The control circuit of claim 1, wherein
the charge provisioning unit comprises a capacitor and a set of charging switches; and
the controller is configured to control the set of charging switches to couple the capacitor to a supply voltage for re-charging, during a charging time interval, when the capacitor is not coupled to a gate-source capacitance of any one of the plurality of high side switches.

5. The control circuit of claim 4, wherein the controller is configured to control the set of charging switches to couple the capacitor to the supply voltage within each of the plurality of phases.

6. The control circuit of claim 1, wherein
the control circuit further comprises a plurality of pre-charging switches for the plurality of high side switches, respectively;
a first pre-charging switch from the plurality of pre-charging switches is configured to couple a gate of a respective first high side switch to a supply voltage; and
the controller is configured to control the first pre-charging switch to couple the gate of the first high side switch to the supply voltage prior to arranging the charging provision unit in parallel to the gate-source capacitance of the first high side switch.

7. The control circuit of claim 1, wherein
the charge provisioning unit comprises a transformer and a pulse generation unit at a primary side of the transformer;
the sets of high control switches are configured to arrange a secondary side of the transformer in parallel to the gate-source capacitance of the respective high side switches; and
the controller is configured to control the pulse generation unit to generate a charge pulse for charging the gate-source capacitance of a high side switch in synchronicity with the respective set of high control switches.

8. The control circuit of claim 1, wherein the charge provisioning unit is configured to provide the electrical charge at a floating voltage.

9. The control circuit of claim 1, wherein the plurality of high side switches comprise a plurality of N-channel metal oxide semiconductor transistors.

10. The control circuit of claim 1, wherein
the plurality of different phases comprise a plurality of different time intervals, respectively;
the plurality of different phases form a commutation cycle having a commutation cycle duration;
the plurality of time intervals of the plurality of phases add up to the commutation cycle duration;
the plurality of high side switches comprise N high side switches with N being an integer greater than 1;
each of the plurality of phases covers a time interval of one over N of the commutation cycle duration; and/or
adjacent phases of the plurality of phases are offset by one over N of the commutation cycle duration with respect to each other.

11. The control circuit of claim 1, wherein
the plurality of bridges comprise a respective plurality of low side switches arranged in series with the plurality of high side switches, respectively; and/or
a source of the high side switch of a bridge is coupled to a drain of the respective low side switch.

12. A multi-phase power converter configured to convert electrical energy at an input voltage into electrical energy at an output voltage; wherein
the multi-phase power converter comprises a plurality of constituent power converters which is operated in a plurality of different phases, respectively;
the plurality of constituent power converters comprises a respective plurality of high side switches; and
the multi-phase power converter comprises the control circuit according to claim 1 for controlling the plurality of parallel high side switches.

13. A method for switching on a plurality of parallel high side switches of a respective plurality of parallel bridges in a respective plurality of different phases; the method comprising
providing an electrical charge using a charge provisioning unit; and
during each of the plurality of different phases, arranging the charge provisioning unit in parallel to a gate-source capacitance of a respective high side switch from the plurality of high side switches, to switch on the respective high side switch, including
generating a first charge pulse for a first high side switch from the plurality of high side switches with the electrical charge provided by the charge provisioning unit, by arranging the charge provisioning unit in parallel to the gate-source capacitance of the first high side switch for a limited on-pulse duration using respective first set of high control switches;
controlling the first set of high control switches to couple the charge provisioning unit to a gate and a source of the first high side switch for the on-pulse duration; and
decoupling the charge provisioning unit from the first high side switch subsequent to the first charge pulse, such that the gate of the first high side switch is floating.

14. The method for switching on a plurality of parallel high side switches of claim 13, wherein the charge provisioning unit comprises a boot-strap capacitor, wherein the high control switches connects the output of the boot-strap capacitor in parallel to the gate-source capacitance of the respective high side switches.

15. The method for switching on a plurality of parallel high side switches of claim 13, wherein the charge provisioning unit comprises a transformer, wherein, the charge provisioning unit comprises a pulse generation unit at a primary side of the transformer, wherein the high control switches connects a secondary side of the transformer in parallel to the gate-source capacitance of the respective high side switches.

16. The method for switching on a plurality of parallel high side switches of claim 13, wherein a non-transitory storage medium comprises a software program adapted for execution on a processor and for performing said method when carried out on the processor.

17. A method for providing a control circuit for controlling a plurality of parallel high side switches of a respective plurality of parallel bridges; comprising the steps of:
  providing a charge provisioning unit to provide an electrical charge;
  providing a plurality of sets of high control switches for the plurality of high side switches, respectively; wherein each set of high control switches arranges the charge provisioning unit in parallel to a gate-source capacitance of the respective high side switch; and
  controlling a respective set of high control switches to arrange the plurality of sets of high control switches to arrange the charge provisioning unit in parallel to the gate-source capacitance of the respective high side switch from the plurality of high side switches, to switch on the respective high side switch by a controller, during a phase of a plurality of different phases, including
  generating a first charge pulse for a first high side switch from the plurality of high side switches with the electrical charge provided by the charge provisioning unit, by arranging the charge provisioning unit in parallel to the gate-source capacitance of the first high side switch for a limited on-pulse duration using a respective first set of high control switches from the plurality of sets of high control switches;
  controlling the first set of high control switches to couple the charge provisioning unit to a gate and a source of the first high side switch for the on-pulse duration; and
  decoupling the charge provisioning unit from the first high side switch subsequent to the first charge pulse, such that the gate of the first high side switch is floating.

18. The method for providing a control circuit of claim 17, wherein the controller generates a first charge pulse for a first high side switch from the plurality of high side switches with the electrical charge provided by the charge provisioning unit, by arranging the charge provisioning unit in parallel to the gate-source capacitance of the first high side switch for a limited on-pulse duration using a respective first set of high control switches from the plurality of sets of high control switches.

19. The method for providing a control circuit of claim 18, wherein the controller controls the first set of high control switches to
  couple the charge provisioning unit to a gate and a source of the first high side switch for the on-pulse duration; and
  decouple the charge provisioning unit from the first high side switch subsequent to the first charge pulse, such that the gate of the first high side switch is floating.

20. The method for providing a control circuit of claim 17, wherein
  the control unit further comprises a plurality of low control switches for the plurality of high side switches, respectively; and
  the controller controls a first low control switch from the plurality of low control switches to short circuit the gate-source capacitance of the respective first high side switch, to switch off the respective first high side switch.

21. The method for providing a control circuit of claim 20, wherein the controller controls the first low control switch to short circuit the gate-source capacitance of the respective first high side switch for a pre-determined limited off-pulse duration.

22. The method for providing a control circuit of claim 17, wherein
  the charge provisioning unit comprises a capacitor and a set of charging switches; and
  the controller controls the set of charging switches to couple the capacitor to a supply voltage for re-charging, during a charging time interval, when the capacitor is not coupled to a gate-source capacitance of any one of the plurality of high side switches.

23. The method for providing a control circuit of claim 22, wherein the controller controls the set of charging switches to couple the capacitor to the supply voltage within each of the plurality of phases.

24. The method for providing a control circuit of claim 17, wherein
  the control circuit further comprises a plurality of pre-charging switches for the plurality of high side switches, respectively;
  a first pre-charging switch from the plurality of pre-charging switches couples a gate of a respective first high side switch to a supply voltage; and
  the controller controls the first pre-charging switch to couple the gate of the first high side switch to the supply voltage prior to arranging the charging provision unit in parallel to the gate-source capacitance of the first high side switch.

25. The method for providing a control circuit of claim 21, wherein
  the charge provisioning unit comprises a transformer and a pulse generation unit at a primary side of the transformer;
  the sets of high control switches arrange a secondary side of the transformer in parallel to the gate-source capacitance of the respective high side switches; and
  the controller controls the pulse generation unit to generate a charge pulse for charging the gate-source capacitance of a high side switch in synchronicity with the respective set of high control switches.

26. The method for providing a control circuit of claim 17, wherein the charge provisioning unit provides the electrical charge at a floating voltage.

27. The method for providing a control circuit of claim 17, wherein the plurality of high side switches comprise a plurality of N-channel metal oxide semiconductor transistors.

28. The method for providing a control circuit of claim 17, wherein
  the plurality of different phases comprise a plurality of different time intervals, respectively;
  the plurality of different phases form a commutation cycle having a commutation cycle duration;
  the plurality of time intervals of the plurality of phases add up to the commutation cycle duration;
  the plurality of high side switches comprise N high side switches with N being an integer greater than 1;
  each of the plurality of phases covers a time interval of one over N of the commutation cycle duration; and/or
  adjacent phases of the plurality of phases are offset by one over N of the commutation cycle duration with respect to each other.

29. The method for providing a control circuit of claim 17, wherein the plurality of bridges comprise a respective plurality of low side switches arranged in series with the plurality of high side switches, respectively; and/or a source of the high side switch of a bridge is coupled to a drain of the respective low side switch.

\* \* \* \* \*